United States Patent
Hsu et al.

(10) Patent No.: US 6,341,097 B1
(45) Date of Patent: Jan. 22, 2002

(54) SELECTIVE ADDRESS SPACE REFRESH MODE

(75) Inventors: Louis L. Hsu, Fishkill, NY (US); Richard Michael Parent, Shelburne, VT (US); Matthew Robert Wordeman, Makawao, HI (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/764,654

(22) Filed: Jan. 17, 2001

(51) Int. Cl.$^7$ ............................................... G11C 7/00
(52) U.S. Cl. ........................................ 365/222; 365/236
(58) Field of Search ................................ 365/222, 236, 365/230.06; 711/106

(56) References Cited

U.S. PATENT DOCUMENTS

| | | | |
|---|---|---|---|
| 4,924,381 A | * 5/1990 | Tokuume | 364/200 |
| 5,148,546 A | 9/1992 | Blodgett | 395/750 |
| 5,251,176 A | * 10/1993 | Komatsu | 365/222 |
| 6,167,484 A | * 12/2000 | Boyer et al. | 711/106 |

* cited by examiner

*Primary Examiner*—Son Mai
(74) *Attorney, Agent, or Firm*—Scully, Scott, Murphy & Presser; Steven Capella

(57) ABSTRACT

A method and system of refreshing a DRAM having a multitude of successive wordlines. The method comprises the step of starting a refresh cycle, and this starting step includes the steps of (I) counting the wordlines one at a time in succession, (ii) refreshing the wordlines counted over a first period t1, and (iii) at the end of period t1, stopping the refreshing of the wordlines, and continuing the counting of the wordlines for a period t2. The method further comprises the step of, after period t2, restarting the refresh cycle. Preferably, the restarting step includes the steps of, at the end of period t2, delaying for a period t3; and restarting the refresh cycle at the end of period t3. The method may include the further step of adjusting the length of the period t1, and preferably, during the combined periods t1 and t2, all of the wordlines are counted. Also, preferably the processing unit determines the memory space to be refreshed; and, more specifically, this may be accomplished by the processing unit issuing a reset signal to terminate the refresh period t1.

20 Claims, 2 Drawing Sheets

BLOCK DIAGRAM OF eDRAM PARTIAL REFRESH SCHEME

SELECTIVE ADDRESS SPACE REFRESH MODE

FIELD OF THE INVENTION

This invention generally relates to methods and systems for refreshing DRAM cells. More specifically, the invention relates to such methods and systems that reduce the power consumed during the refreshing of the DRAM cells.

BACKGROUND OF THE INVENTION

DRAMs are widely used as memory storage devices in many electronic items. This widespread use is due to the facts, among others, that DRAMs are compact, inexpensive, highly reliable, and have relatively large capacities. Recently, attention has been directed to fabricating DRAMS directly on processor chips, and such DRAMs are referred to as embedded DRAMs, or eDRAMs. These eDRAMs are very well suited for use with portable devices such as portable computers, portable telephones, and other portable or handheld devices.

Embedded DRAMs, when used in hand held applications, need to minimize the current draw to aid in prolonging battery life. Since the majority of the time handheld devices are in a "standby" state, reducing the off current for the eDRAM is most important. There are three basic components of off-current: refresh current, circuit operating current and device leakage current. The present invention addresses a way to reduce or minimize the refresh current component.

Embedded DRAMs offer a "refresh-address-counter," or RAC which allows the system to simply present a REFRESH command to the eDRAM and the appropriate wordline is refreshed, since this on chip counter keeps track of that address. One example of the RAC operation is to reset to the wordline address (to the first word line) at power-on, to increment through the entire word address space and then return to the first wordline address upon refreshing the last wordline in the eDRAM design. The "refresh rate" at which this must occur is typically in the 1–10 usec range and is a function of the technology retention time. Each time the eDRAM performs a RAC controlled refresh, current is drawn from the supply, leading to battery drain.

There are some hand held applications that utilize the full memory space during normal operation, but do no need to retain that entire space during "standby." Since the standard RAC operation would step methodically through the entire wordline address space, power would be dissipated in refreshing some array elements whose data retention is not required.

SUMMARY OF THE INVENTION

An object of this invention is to improve methods and systems for refreshing the memory cells of DRAMs.

Another object of the present invention is to provide a partial refresh scheme for refreshing a portion of the memory cells of a DRAM.

A further object of this invention is to provide a partial refresh scheme for a DRAM that is very easy to adjust.

Another object of this invention is to reduce the standby current drawn by an eDRAM by limiting the refreshed address space to the minimum required by the system to retain data.

These and other objectives are attained with a method and system of refreshing a DRAM having a multitude of successive wordlines. The method comprises the step of starting a refresh cycle, and this starting step includes the steps of (I) counting the wordlines one at a time in succession, (ii) refreshing the wordlines counted over a first period t1, and (iii) at the end of period t1, stopping the refreshing of the wordlines, and continuing the counting of the wordlines for a period t2. The method further comprises the step of, after period t2, restarting the refresh cycle. Preferably, the restarting step includes the steps of, at the end of period t2, delaying for a period t3; and restarting the refresh cycle at the end of period t3. The method may include the further step of adjusting the length of the period t1 to change the number of wordlines refreshed during the refresh cycle. Also, preferably, during the combined periods t1 and t2, all of the wordlines are counted.

An 8 Mbit eDRAM macro can be used to illustrate the potential current savings of this invention. An 8 Mbit macro has a total of 4096 wordlines that, if the entire array space needs to retain data, with a technology cell refresh rate of 3.2 ms, requires a refresh rate of: 3.2 ms/4096=0.7 us. Assuming that each 20 ms refresh cycle draws 50 mA, then the current needed to refresh the entire array is 1.28 mA. By implementing the present invention into the RAC, this power can be reduced by the ratio: required wordline space/total wordlines pace. As an example, if ½ the wordlines with data needed to be retained, then current is halved to 0.64 mA.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
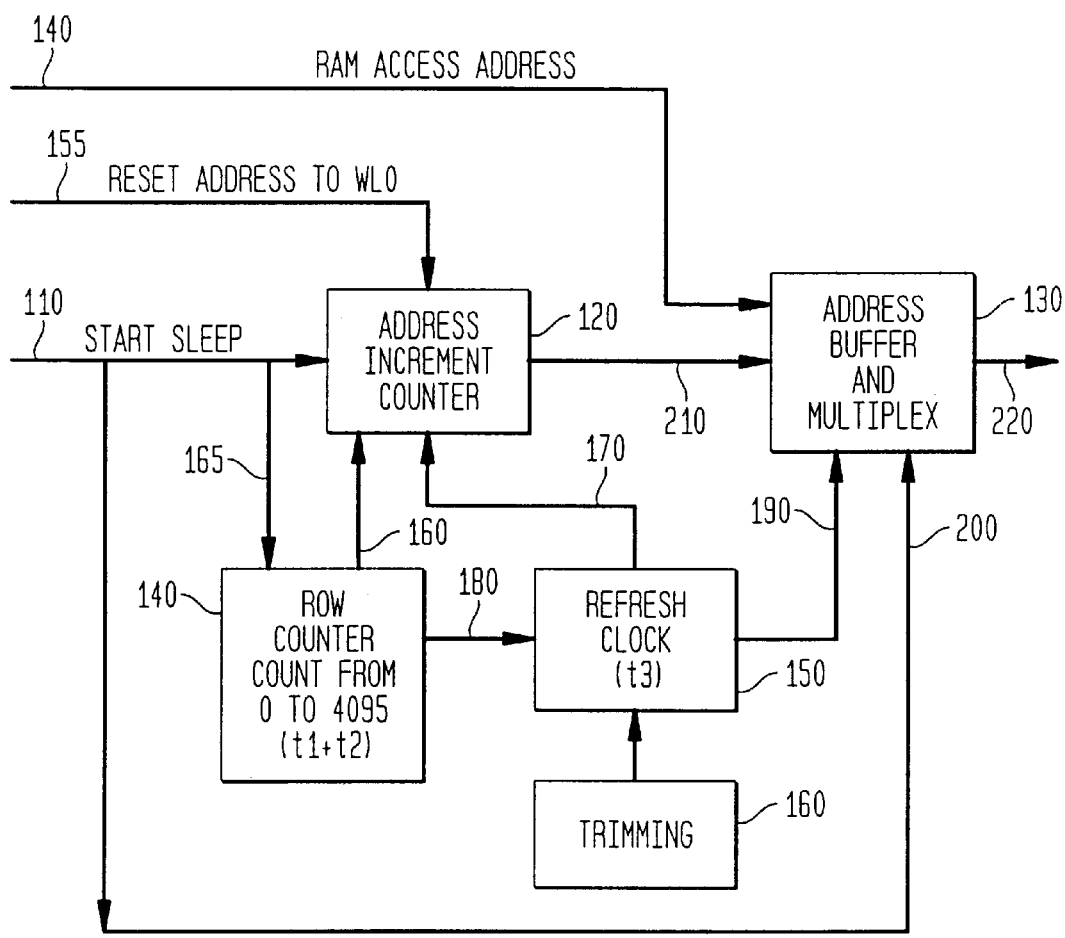
FIG. 1 is a block diagram of an eDRAM partial refresh scheme embodying this invention.

With reference to FIG. 1, when a sleep mode (or other low-power mode) is activated 110, the refresh always starts from address of word-line WL0. The address increment counter 120 will start counting addresses from WL0 WL1, and so on. These addresses will be created in an address buffer 130 in the eDRAM for refresh in a burst mode. Whenever the central processing unit (CPU) (not shown) detects the last address, a reset signal 155 will be sent to the address counter, so that no addresses will be selected and the refresh operation will stop.

Figure 2:
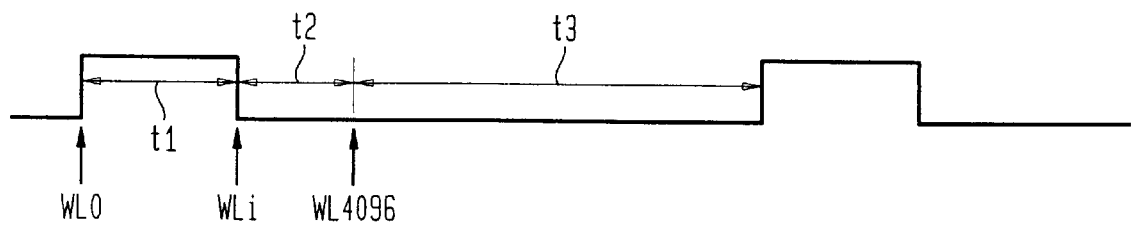
FIG. 2 is a timing diagram illustrating time periods used in the present invention.

However, the row counter 140 in the eDRAM will continue counting the remaining row numbers for timing purposes. With reference to FIGS. 1 and 2, when all the wordlines in the array are counted, the total elapsed time will be t1+t2, and a signal will be sent to a refresh clock 150. The refresh clock is a timer which determines the refresh cycle t3 based on cell retention time. Therefore, after this delay, the burst refresh will start again from WL0.

Figure 3:
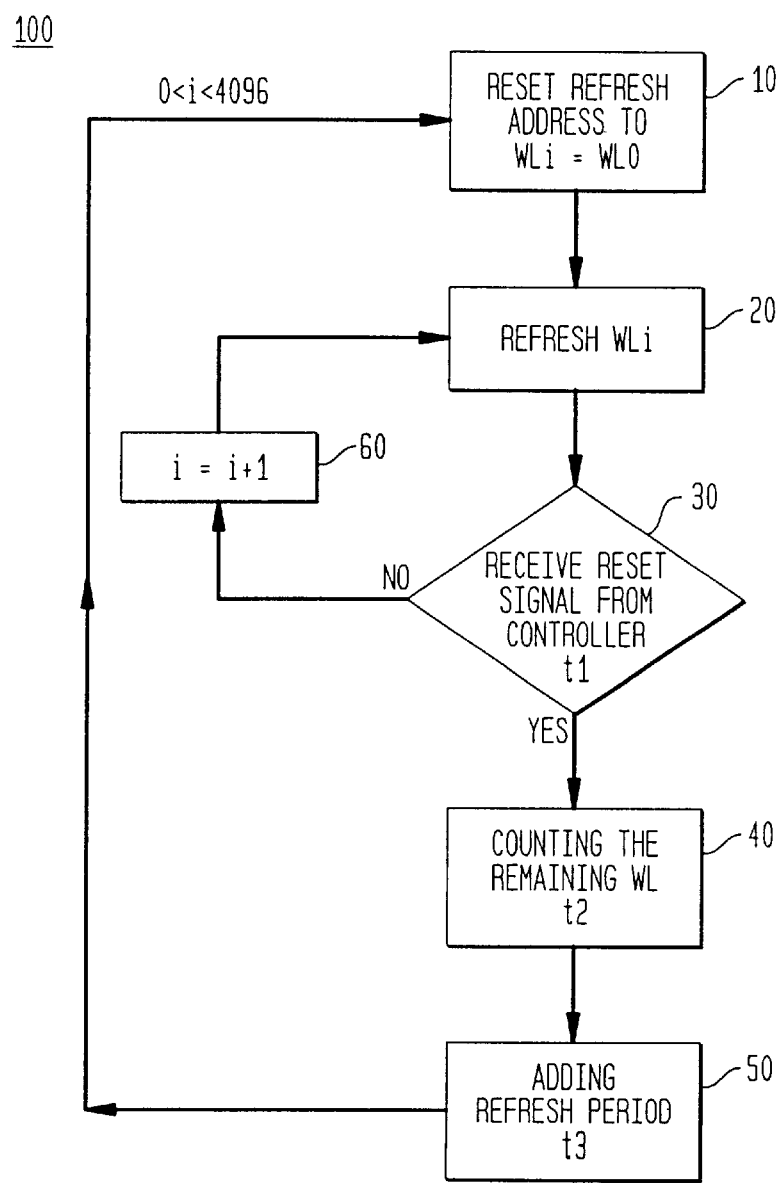
FIG. 3 is a flow chart outlining a method for carrying out this invention.

The timing diagram of FIG. 2 and the flow chart of FIG. 3 clearly teach a method of how to perform a partial array refresh and how to adjust the refresh timing. The waveform of FIG. 2 indicates period t1 is the partial refresh period, when all the wordlines from WL0 to Wli are refreshed in a burst mode. The period t2 is the delay time set by the row counter to continue counting the remaining wordlines which do not need to be refreshed. Therefore, t1+t2 is the total time required to refresh the whole array. The greater the portion of the array which does not need to be refreshed, the longer the period t2, and the more power saving resulting from the partial refresh. Also, preferably the processing unit determines the memory space to be refreshed; and, more specifically, this may be accomplished by the processing unit issuing a reset signal to terminate the refresh period t1. Period t3 is determined by the retention time which is almost constant for any given technology under a certain temperature.

The flow chart of FIG. 3 indicates how this burst refresh is done. In the sleep mode, the CPU calls for a burst refresh starting from WL0 (block 10). The array will perform wordline refresh from WL0, WL1, WL2, ... and so on, until the CPU stops the refresh. Whenever a reset signal is received 30, the refresh operation is stopped. However, the counter will continue counting the rest of the wordlines as if they all need to be refreshed. A delay time t2 is thus established when the counter counts the rest of these wordlines. Then another delay period t3 is created by a refresh timer which is trimmable based on the cell retention time. When all the time t1+t2+t3 has been reached, the CPU will start the refresh cycle from WL0 again.

The present invention has a number of important advantages. The invention is a very simple design, and there is no need to change the refresh controller. Also, it is easy to implement the flexible refresh cycle, and very easy to interface with the CPU.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of refreshing a DRAM having a multitude of successive wordlines, the method comprising:

starting a refresh cycle, the refresh cycle including the steps of
i) counting the wordlines one at a time in succession,
ii) refreshing the wordlines counted over a first period t1, and
iii) at the end of the period t1, stopping the refreshing of the wordlines, and continuing the counting of the wordlines for a period t2; and after the period t2, restarting the refresh cycle.

2. A method according to claim 1, wherein the restarting step includes the steps of:

at the end of the period t2, delaying for a period t3; and
restarting the refresh cycle at the end of the period t3.

3. A method according to claim 1, further including the step of adjusting the length of a period t3.

4. A method according to claim 1, wherein, during the combined period t1 and t2, all of the wordlines are counted.

5. A method according to claim 1, wherein:

each of the wordlines has a respective one address; and
the counting step includes the step of storing in an address buffer, the addresses of the wordlines counted during period t1.

6. A method according to claim 1, wherein:

the wordlines are arranged in succession starting with wordline WL0 and ending at wordline Wln; and
the counting step includes the step of starting the counting of the wordlines at wordline WL0.

7. A method according to claim 1, wherein the refreshing step includes the step of refreshing the wordlines counted over the period t1 in a burst mode.

8. A system for refreshing a DRAM having a multitude of successive wordlines, the system comprising:

a processing unit to start a refresh cycle,
a counter for counting the wordlines one at a time in succession,
a timer to measure a first time period t1 and a second time period t2; and
means for refreshing the wordlines counted over the first period t1; wherein at the end of the period t1, the refreshing of the wordlines is stopped, and the counting of the wordlines continues for the period t2; and
the processor unit restarts the refresh cycle after the period t2.

9. A system according to claim 8, wherein:

the timer measures a third time period t3;
the processor unit further includes means for delaying for the period t3 at the end of the period t2; and
the processor unit restarts the refresh cycle at the end of the period t3.

10. A system according to claim 8, further including a trimmer for adjusting the length of a period t3.

11. A system according to claim 8, wherein, during the combined periods t1 and t2, all of the wordlines are counted.

12. A system according to claim 8, wherein:

each of the wordlines has a respective one address; and
the system further includes an address buffer for storing the addresses of the wordlines counted during period t1.

13. A system according to claim 8, wherein:

the wordlines are arranged in succession starting with wordline WL0 and ending at wordline Wln; and
the counter starts counting the wordlines at wordline WL0.

14. A system according to claim 8, wherein the processing unit issues a reset signal to terminate the refresh period t1.

15. A program storage device readable by machine, tangibly embodying a program of instructions executable by the machine to perform method steps for refreshing a DRAM having a multitude of successive wordlines, said method steps comprising:

starting a refresh cycle, the refresh cycle including the steps of
i) counting the wordlines one at a time in succession,
ii) refreshing the wordlines counted over a first period t1, and
iii) at the end of the period t1, stopping the refreshing of the wordlines, and continuing the counting of the wordlines for a period t2; and after the period t2, restarting the refresh cycle.

16. A program storage device according to claim 15, wherein the restarting step includes the steps of:

at the end of the period t2, delaying for a period t3; and
restarting the refresh cycle at the end of the period t3.

17. A program storage device according to claim 15, wherein said method steps further include the step of adjusting the length of a period t3.

18. A program storage device according to claim 15, wherein, during the combined periods t1 and t2, all of the wordlines are counted.

19. A program storage device according to claim 15, wherein:

each of the wordlines has a respective one address; and and counting step includes the step of storing in an address buffer, the addresses of the wordlines counted during period t1.

20. A program storage device according to claim 15, wherein:

the wordlines are arranged in succession starting with wordline WL0 and ending at wordline Wln; and the counting step includes the step of starting the counting of the wordlines at wordline WL0.

\* \* \* \* \*